(12) United States Patent
Lee

(10) Patent No.: US 11,488,639 B2
(45) Date of Patent: Nov. 1, 2022

(54) INPUT CIRCUIT CAPABLE OF STABILIZING POWER VOLTAGE AND MEMORY DEVICE INCLUDING THE SAME

(71) Applicant: SK hynix Inc., Icheon (KR)

(72) Inventor: Seung Ho Lee, Seoul (KR)

(73) Assignee: SK hynix Inc., Icheon (KR)

( * ) Notice: Subject to any disclaimer, the term of this patent is extended or adjusted under 35 U.S.C. 154(b) by 102 days.

(21) Appl. No.: 16/894,498

(22) Filed: Jun. 5, 2020

(65) Prior Publication Data

US 2021/0183413 A1    Jun. 17, 2021

(30) Foreign Application Priority Data

Dec. 12, 2019   (KR) .................... 10-2019-0165949

(51) Int. Cl.
*G11C 5/14*         (2006.01)
*H03K 19/003*   (2006.01)
*G11C 16/10*     (2006.01)
*G11C 16/30*     (2006.01)

(52) U.S. Cl.
CPC ............. *G11C 5/147* (2013.01); *G11C 16/10* (2013.01); *H03K 19/00384* (2013.01); *G11C 16/30* (2013.01)

(58) Field of Classification Search
CPC ....... G11C 7/10; G11C 7/1057; G11C 7/1084; G11C 16/30; G11C 5/148; G11C 5/147
See application file for complete search history.

(56) References Cited

U.S. PATENT DOCUMENTS

| 7,282,953 | B2 | 10/2007 | Wu et al. | |
| 2012/0081986 | A1* | 4/2012 | Joo | G11C 11/4091 |
| | | | | 365/207 |
| 2012/0084490 | A1* | 4/2012 | Choi | G11C 29/42 |
| | | | | 711/E12.008 |
| 2013/0250704 | A1* | 9/2013 | Furutani | G11C 7/1057 |
| | | | | 365/189.11 |

FOREIGN PATENT DOCUMENTS

KR     20190024663 A     3/2019

* cited by examiner

*Primary Examiner* — Alfredo Bermudez Lozada

(57) ABSTRACT

An input circuit includes: a buffer circuit coupled to a pad, the buffer circuit being driven by a first power voltage; a level shifter circuit coupled to an output terminal of the buffer circuit, the level shifter circuit being driven by a second power voltage; and a voltage stabilization circuit coupled to an input node of the level shifter circuit, the voltage stabilization circuit being driven by the first power voltage and the second power voltage. The voltage stabilization circuit maintains a voltage of the input node of the level shifter circuit equal to or less than a given level sufficient to keep an output signal of the level shifter circuit at a specific logic value, when a voltage level of the second power voltage is rising and a voltage level of the first power voltage is kept at a low level.

15 Claims, 13 Drawing Sheets

INPUT CIRCUIT CAPABLE OF STABILIZING POWER VOLTAGE AND MEMORY DEVICE INCLUDING THE SAME

CROSS-REFERENCE TO RELATED APPLICATION

The present application claims priority under 35 U.S.C. § 119(a) to Korean patent application number 10-2019-0165949, filed on Dec. 12, 2019, in the Korean Intellectual Property Office, the entire disclosure of which is incorporated herein by reference.

BACKGROUND

1. Technical Field

The present disclosure generally relates to an electronic device, and more particularly, to a memory device and a memory system having an input circuit.

2. Related Art

With the development of technology, a recent semiconductor device has used several power voltages. As the several power voltages are used, the operational performance of the semiconductor device can be improved, and the power efficiency of the semiconductor device can be increased. However, when the several power voltages are used, the operational stability of the semiconductor device may be deteriorated according to the sequence of increasing several power voltages. Therefore, it is desirable to develop an input circuit which can stably operate even in various situations in which several power voltages increase.

SUMMARY

Embodiments of the present disclosure provide a memory device and a memory system having an input circuit capable of improving the stability of the memory system.

In accordance with an aspect of the present disclosure, there is provided an input circuit including: a buffer circuit coupled to a pad, the buffer circuit being driven by a first power voltage; a level shifter circuit coupled to an output terminal of the buffer circuit, the level shifter circuit being driven by a second power voltage; and a voltage stabilization circuit coupled to an input node of the level shifter circuit, the voltage stabilization circuit being driven by the first power voltage and the second power voltage, wherein the voltage stabilization circuit maintains a voltage of the input node of the level shifter circuit equal to or less than a given level sufficient to keep an output signal of the level shifter circuit at a specific logic value, when a voltage level of the second power voltage is rising and a voltage level of the first power voltage is kept at a low level.

The buffer circuit may include: a first inverter coupled to the pad, the first inverter being driven by the first power voltage and a ground voltage; and a second inverter coupled to an output terminal of the first inverter, the second inverter being driven by the first power voltage and the ground voltage.

The level shifter circuit may include: a third inverter coupled to an output terminal of the second inverter, the third inverter being driven by the second power voltage and the ground voltage; and a fourth inverter coupled to an output terminal of the third inverter, the fourth inverter being driven by the second power voltage and the ground voltage.

The voltage stabilization circuit may include: a fifth inverter receiving the first power voltage as an input, the fifth inverter being driven by the second power voltage and the ground voltage; and an NMOS transistor coupled between the ground voltage and the input node of the level shifter circuit, the NMOS transistor having a gate terminal coupled to an output terminal of the fifth inverter.

The fifth inverter may provide an output signal having a high level to the gate terminal of the NMOS transistor, when the voltage level of the second power voltage is rising and the voltage level of the first power voltage is kept at the low level.

The NMOS transistor may be turned on to supply the ground voltage to the input node of the level shifter circuit, in response to the output signal having the high level.

When the buffer circuit is turned off, the voltage stabilization circuit may maintain the voltage at the input node of the level shifter circuit equal to or less than the given level, using the ground voltage supplied from the NMOS transistor.

The low level may be a first low level. When the voltage level of the first power voltage rises, the fifth inverter may provide an output signal having a second low level to the gate terminal of the NMOS transistor.

The NMOS transistor may be turned off to decouple the input node from the ground voltage in response to the output signal having the second low level.

The first power voltage may rise to a first target voltage level, and the second power voltage may rise to a second target voltage level lower than the first target voltage level.

The low level may be 0V.

The voltage stabilization circuit may be turned off, when the voltage level of the first power voltage is rising and the voltage level of the second power voltage is kept a t the low level.

In accordance with another aspect of the present disclosure, there is provided a memory device including: a memory cell array including a plurality of memory blocks, each of the plurality of memory blocks including a plurality of memory cells; one or more peripheral circuits configured to perform an operation on a memory block selected from the plurality of memory blocks; and a control logic configured to control the peripheral circuits. The peripheral circuits include an input/output circuit configured to handle one or more of a command, an address, and data. The input/output circuit includes: a buffer circuit coupled to a pad, the buffer circuit being driven by a first power voltage; a level shifter circuit coupled to an output terminal of the buffer circuit, the level shifter circuit being driven by a second power voltage; and a voltage stabilization circuit coupled to an input node of the level shifter circuit, the voltage stabilization circuit being driven by the first power voltage and the second power voltage, wherein the voltage stabilization circuit maintains a voltage of the input node of the level shifter circuit equal to or less than a given level sufficient to keep an output signal of the level shifter circuit at a specific logic value, when a voltage level of the second power voltage is rising and a voltage level of the first power voltage is kept at a low level.

The voltage stabilization circuit may include: a logic device receiving the first power voltage as an input, the logic device being driven by the second power voltage and the ground voltage; and a switching device coupled between the ground voltage and the input node of the level shifter circuit, the switching device having a control terminal coupled to an output terminal of the logic device.

The logic device may include an inverter and the switching device may include an NMOS transistor.

The buffer circuit may include: a first inverter coupled to the pad, the first inverter being driven by the first power voltage and a ground voltage; and a second inverter coupled to an output terminal of the first inverter, the second inverter being driven by the first power voltage and the ground voltage.

The level shifter circuit may include: a third inverter coupled to an output terminal of the second inverter, the third inverter being driven by the second power voltage and the ground voltage; and a fourth inverter coupled to an output terminal of the third inverter, the fourth inverter being driven by the second power voltage and the ground voltage.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the present disclosure, advantages, features and methods for achieving them will become more apparent after a reading of the following embodiments taken in conjunction with the drawings. Embodiments of the present disclosure may, however, be implemented in different forms and should not be construed as being limited to the embodiments set forth herein. Rather, these embodiments are provided to describe the present disclosure in detail to the extent that those skilled in the art to which the disclosure pertains may easily enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
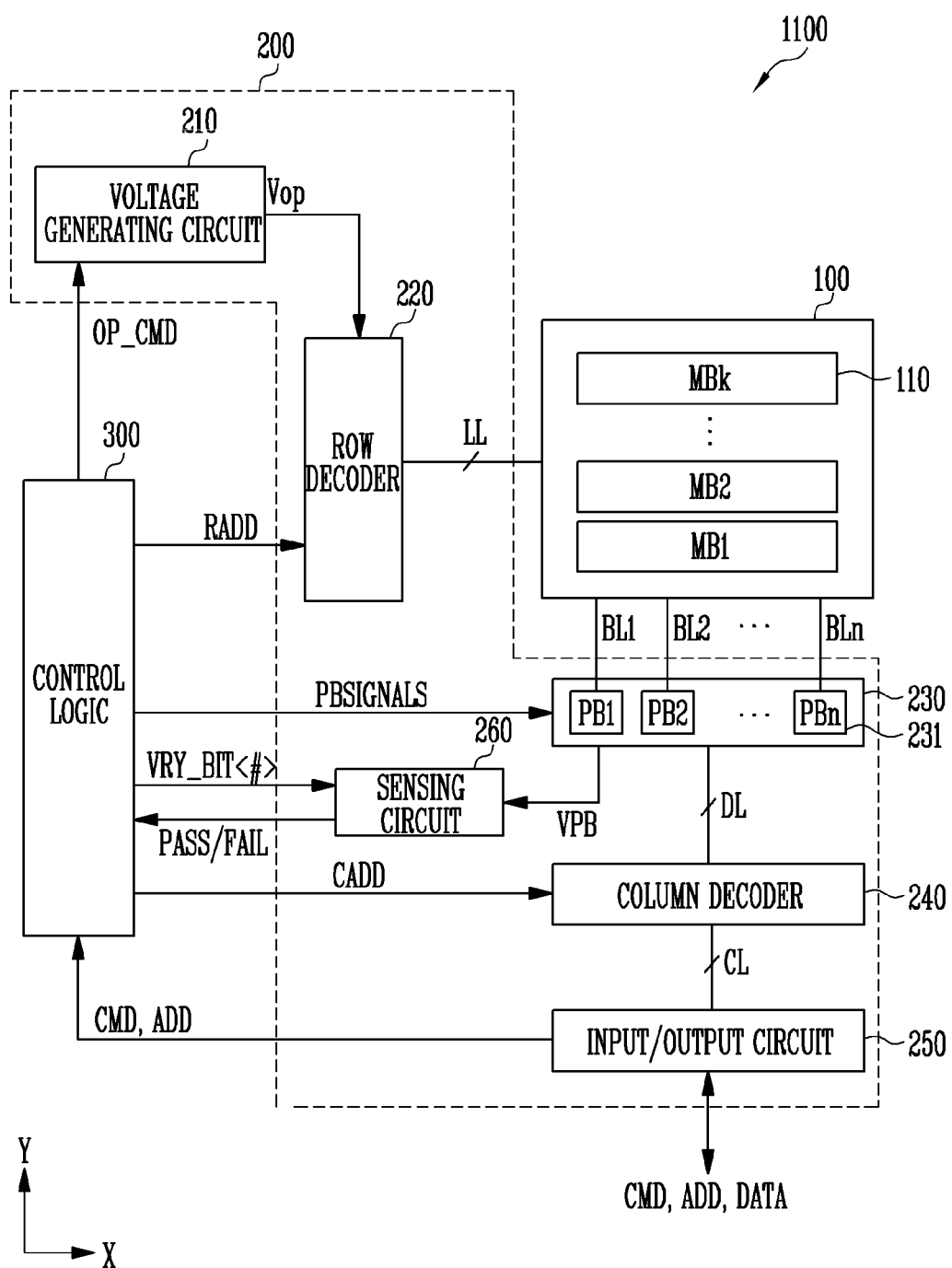
FIG. 1 is a diagram illustrating a memory device.

FIG. 1 is a diagram illustrating a memory device 1100.

Referring to FIG. 1, the memory device 1100 may include a memory cell array 100 in which data is stored. The memory device 1110 may include peripheral circuits 200 configured to perform a program operation for storing data in the memory cell array 100, a read operation for outputting the stored data, and an erase operation for erasing the stored data. The memory device 1110 may include a control logic 300 which controls the peripheral circuits 200 under the control of a memory controller (e.g., a memory controller 1200 shown in FIG. 2).

The memory cell array 100 may include a plurality of memory blocks MB1 to MBk (k is a positive integer). Local lines LL and bit lines BL1 to BLn (n is a positive integer) may be coupled to each of the memory blocks MB1 to MBk. For example, the local lines LL may include a first select line, a second select line, and a plurality of word lines arranged between the first and second select lines. Also, the local lines LL may include dummy lines arranged between the first select line and the word lines and between the second select line and the word lines. The first select line may be a source select line, and the second select line may be a drain select line. For example, the local lines LL may include word lines, drain and source select lines, and source lines. For example, the local lines LL may further include dummy lines. For example, the local lines LL may further include pipe lines. The local lines LL may be coupled to each of the memory blocks MB1 to MBk, and the bit lines BL1 to BLn may be commonly coupled to the memory blocks MB1 to MBk. The memory blocks MB1 to MBk may be implemented in a two-dimensional or three-dimensional structure. For example, memory cells may be arranged in a direction parallel to a substrate in memory blocks MB1 to MBk having a two-dimensional structure. For example, memory cells may be stacked in a direction vertical to a substrate in memory blocks MB1 to MBk having a three-dimensional structure.

The peripheral circuits 200 may be configured to perform program, read, and erase operations of a selected memory block 110 from the plurality of memory blocks MB1 to MBk under the control of the control logic 300. For example, the peripheral circuits 200 may supply a verify voltage and pass voltages to the first select line, the second select line, and the word lines, selectively discharge the first select line, the second select line, and the word lines, and verify memory cells coupled to a selected word line among the word lines, under the control of the control logic 300. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to the local lines LL coupled to the selected memory block 110 in response to a row address RADD.

The page buffer group 230 may include a plurality of page buffers PB1 to PBn coupled to the bit lines BL1 to BLn. The page buffers PB1 to PBn may operate in response to page buffer control signals PBSIGNALS. For example, the page buffers PB1 to PBn may temporarily store data received through the bit lines BL1 to BLn, or sense voltages or currents of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the memory controller, to the control logic 300, or exchange data DATA with the column decoder 240.

In a read operation or a verify operation, the sensing circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address ADDR, the page buffer control signals PBSIGNALS, and the allow bit VRY_BIT<#> in response to a command CMD and an address ADD. Also, the control logic 300 may determine whether a verify operation has passed or failed in response to the pass signal PASS or fail signal FAIL.

Figure 2:
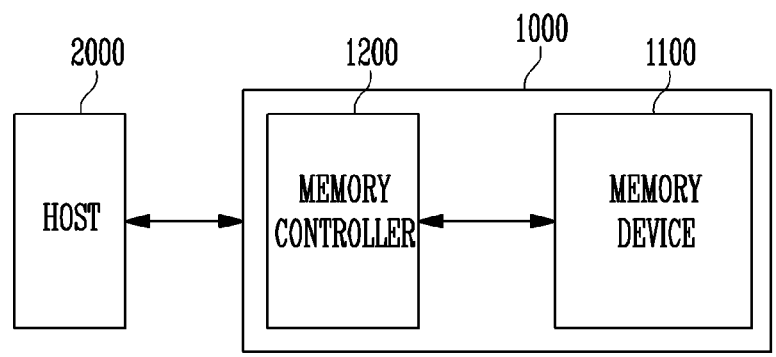
FIG. 2 is a diagram illustrating a memory system.

FIG. 2 is a diagram illustrating a memory system 1000.

Referring to FIG. 2, the memory system 1000 may include a memory device 1100 configured to store data and a memory controller 1200 configured to control the memory device 1100 under the control of a host 2000.

The host 2000 may communicate with the memory system 1000, using at least one of various communication schemes, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The memory controller 1200 may control the overall operations of the memory system 1000, and control data exchange between the host 2000 and the memory device 1100. For example, the memory controller 1200 may program or read data by controlling the memory device 1100 in response to a request from the host 2000. Also, the memory controller 1200 may store information on main memory blocks and sub-memory blocks, which are included in the memory device 1100, and select the memory device 1100 such that a program operation is performed on a main memory block or a sub-memory block according to an amount of data loaded to perform the program operation. In some embodiments, the memory device 1100 may include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), and a flash memory.

The memory device 1100 may perform a program, read or erase operation under the control of the memory controller 1200.

Figure 3:
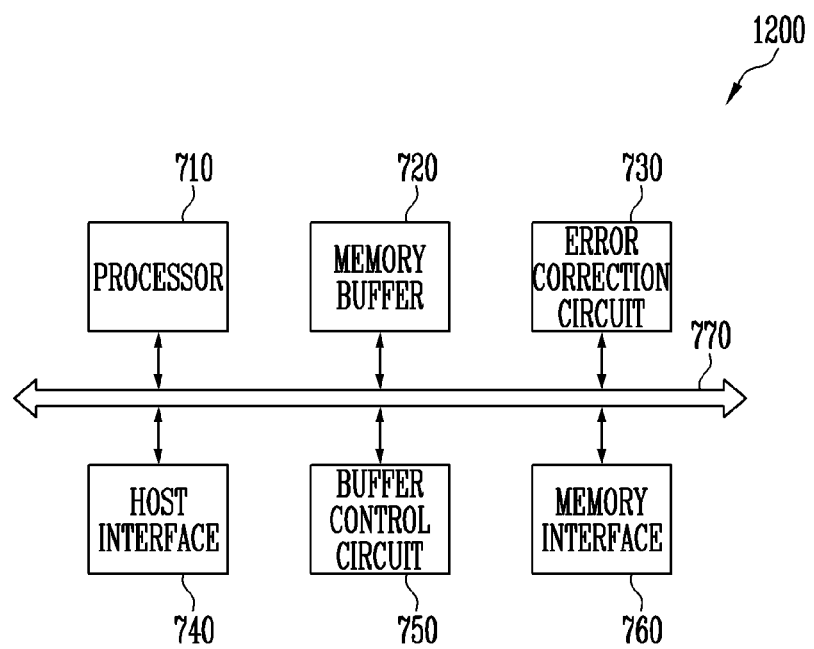
FIG. 3 is a diagram illustrating a memory controller shown in FIG. 2.

FIG. 3 is a diagram illustrating the memory controller 1200 shown in FIG. 2.

Referring to FIG. 3, the memory controller 1200 may include a processor 710, a memory buffer 720, an error correction circuit 730, a host interface 740, a buffer control circuit 750, a memory interface 760, and a bus 770.

The bus 770 may provide a channel between components of the memory controller 1200.

The processor 710 may control the overall operations of the memory controller 1200, and perform a logical operation. The processor 710 may communicate with the external host 2000 through the host interface 740, and communicate with the memory device 1100 through the memory interface 760. Also, the processor 710 may communicate with the memory buffer 720 through the buffer control circuit 750. The processor 710 may control an operation of the memory system 1000 by using the memory buffer 720 as a working memory, a cache memory, or a buffer memory.

The memory buffer 720 may be used as a working memory, a cache memory, or a buffer memory of the processor 710. The memory buffer 720 may store codes and commands, which are executed by the processor 710. The memory buffer 720 may store data processed by the processor 710. The memory buffer 720 may include a Static RAM (SRAM) or a Dynamic RAM (DRAM).

The error correction circuit 730 may perform error correction. The error correction circuit 730 may perform Error Correction Code (ECC) encoding, based on data to be written to the memory device 1100 through the memory interface 760. The ECC-encoded data may be transferred to the memory device 1100 through the memory interface 760. The error correction circuit 730 may perform ECC decoding on data received from the memory device 1100 through the memory interface 760. In an example, the error correction circuit 730 may be included in the memory interface 760 as a component of the memory interface 760.

The host interface 740 communicates with the external host 2000 under the control of the processor 710. The host interface 740 may communicate with the external host 2000, using at least one of various communication schemes, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer controller 750 controls the memory buffer 720 under the control of the processor 710.

The memory interface 760 communicates the memory device 1100 under the control of the processor 710. The memory interface 760 may communicate a command, an address, and data with the memory device 1100 through the channel.

Figure 4:
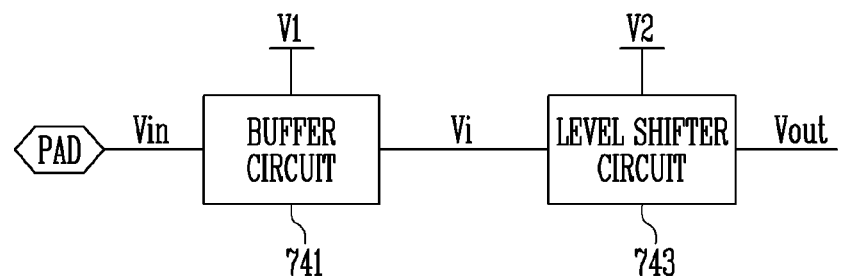
FIG. 4 is a block diagram illustrating an input circuit in accordance with an embodiment of the present disclosure.

FIG. 4 is a block diagram illustrating an input circuit in accordance with an embodiment of the present disclosure.

The input/output circuit 250 shown in FIG. 1 or the host interface 740 shown in FIG. 3 may be implemented as an input circuit as shown in FIG. 4. For example, each of the input/output circuit 250 and the host interface 740 may include the input circuit of FIG. 4. The input circuit may receive a signal applied through a pad PAD from an external device or a host (e.g., the host 2000 in FIG. 2). The signal may be a control signal including a command and an address, or be a data signal. A voltage of an input voltage applied through the pad PAD may be equal to or different from an input terminal power voltage VDDO or an internal power voltage VDD.

Referring to FIG. 4, the input circuit may include a buffer circuit 741 and a level shifter circuit 743. The buffer circuit 741 may be driven by a first power voltage V1. Also, the buffer circuit 741 may receive an input voltage signal Vin from the pad PAD and output an internal voltage signal Vi. The internal voltage signal Vi may be transferred to the level shifter circuit 743.

The level shift circuit 743 may be driven by a second power voltage V2. The level shifter circuit 743 may convert the internal voltage signal Vi transferred from the buffer circuit 741 into a signal having a voltage swing of the second power voltage V2. For example, the internal voltage signal Vi may be a signal having a range from 0V to the first power voltage V1, and the level shifter circuit 743 may convert the internal voltage signal Vi into an output voltage signal Vout having a range from 0V to the second power voltage V2. The second power voltage V2 may be a voltage slightly lower than the first power voltage V1. In an example, the first power voltage V1 may be a voltage of 1.8V, and the second power voltage V2 may be a voltage of 0.9V. That is, when the internal voltage signal Vi has a voltage swing of 1.8V, the output voltage signal Vout may be a signal having a voltage swing of 0.9V.

Figure 5:
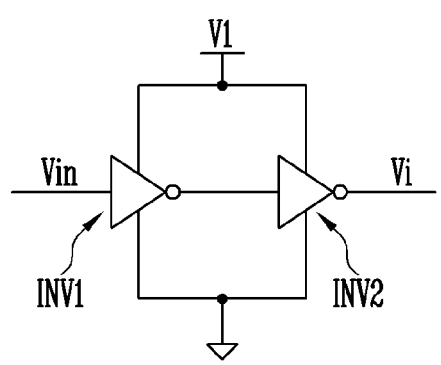
FIG. 5 is a diagram illustrating a buffer circuit shown in FIG. 4 in accordance with an embodiment of the present disclosure.

FIG. 5 is a diagram illustrating the buffer circuit 741 shown in FIG. 4 according to an embodiment.

Referring to FIG. 5, the buffer circuit 741 may include a first inverter INV1 and a second inverter INV2. The first inverter INV1 may invert the input voltage signal Vin and output the inverted signal. The second inverter INV2 may receive an output of the first inverter INV1, and invert the output and then output the inverted output as the internal voltage signal Vi. The first and second inverters INV1 and INV2 may be driven by a ground voltage and the first power voltage V1. Therefore, the internal voltage signal Vi may be a signal having a range from 0V to the first power voltage V1.

Figure 6:
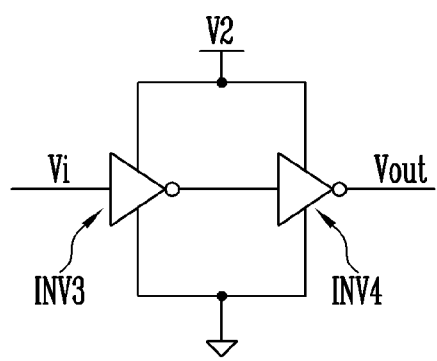
FIG. 6 is a diagram illustrating a level shifter circuit shown in FIG. 4 in accordance with an embodiment of the present disclosure.

FIG. 6 is a diagram illustrating the level shifter circuit 743 shown in FIG. 4 according to an embodiment.

Referring to FIG. 6, the level shift circuit 743 may include a third inverter INV3 and a fourth inverter INV4. The third inverter INV3 may invert the internal voltage signal Vi and output the inverted signal. The fourth inverter INV4 may receive an output of the third inverter INV3, and invert the output and then output the inverted output as the output voltage signal Vout. The third and fourth inverters INV3 and INV4 may be driven by a ground voltage and the second power voltage V2. Therefore, the output voltage signal Vout may be a signal having a range from 0V to the second power voltage V2.

Figure 7:
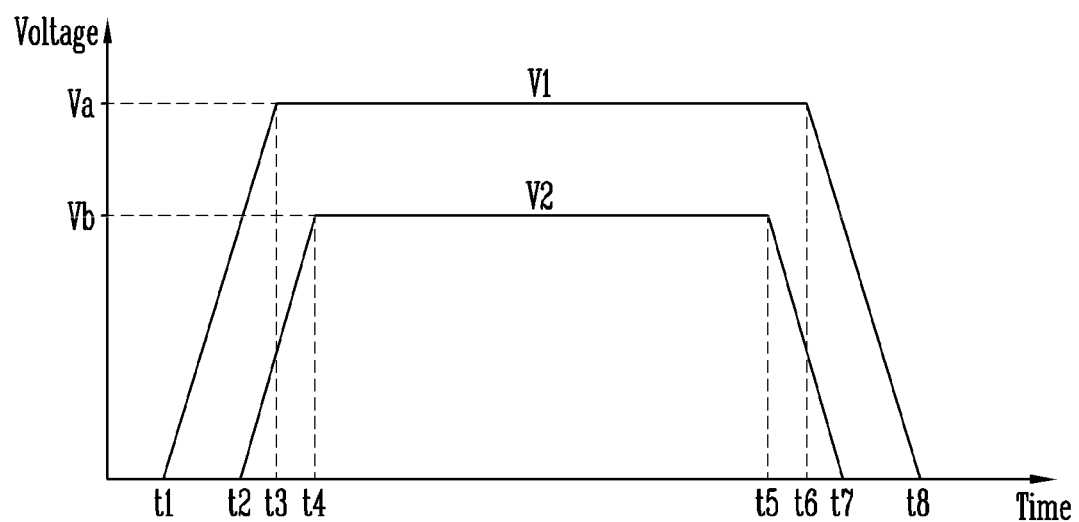
FIG. 7 is a graph illustrating an example of voltage levels of a first power voltage and a second power voltage, which are input to the input circuit.

FIG. 7 is a graph illustrating an example of voltage levels of the first power voltage V1 and the second power voltage V2, which are input to an input circuit (e.g., the input circuit of FIG. 4).

Referring to FIG. 7, the voltage level of the first power voltage V1 starts rising at a first time t1, and the voltage level of the second power voltage V2 starts rising at a second time t2. The first power voltage V1 reaches a first target voltage level Va at a third time t3, and the second power voltage V2 reaches a second target voltage level Vb at a fourth time t4.

Referring to a period from the first time t1 to the fourth time t4, since the first power voltage V1 starts rising earlier than the second power voltage V2, the buffer circuit 741 of the input circuit is driven, and then the level shifter circuit 743 of the input circuit is driven.

Therefore, the internal voltage signal Vi is output from the buffer circuit 741, and an output voltage of the third inverter V3 of the level shifter circuit 743 becomes a signal obtained by inverting the internal voltage signal Vi. That is, when the first power voltage V1 rises earlier than the second power voltage V2, the input circuit can stably operate.

Subsequently, the second power voltage V2 starts falling from the second target voltage level Vb at a fifth time t5, and the first power voltage V1 starts falling from the first target voltage level Va at a sixth time t6. The second power voltage V2 reaches a voltage level of 0V at a seventh time t7, and the first power voltage V1 reaches the voltage level of 0V at an eighth time t8.

Referring to a period from the fifth time t5 to the eighth time t8, since the second power voltage V2 starts falling earlier than the first power voltage V1, the level shifter circuit 743 of the input circuit becomes inactivated, and then the buffer circuit 741 of the input circuit becomes inactivated.

As shown in FIG. 7, when the first power voltage V1 starts rising earlier than the second power voltage V2, and the second power voltage V2 starts falling earlier than the first power voltage V1, the input circuit can stably operate.

Figure 8:
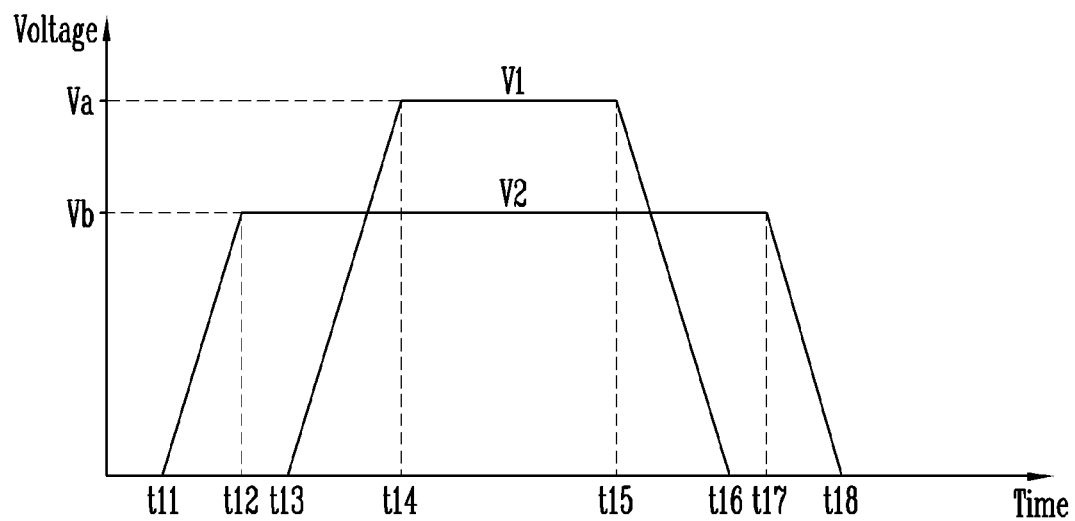
FIG. 8 is a graph illustrating an example of the voltage levels of the first power voltage and the second power voltage, which are input to the input circuit.

FIG. 8 is a graph illustrating an example of the voltage levels of the first power voltage V1 and the second power voltage V2, which are input to the input circuit.

Referring to FIG. 8, the voltage level of the second power voltage V2 starts rising at a first time t11 and reaches the second target voltage level Vb at a second time t12. Meanwhile, the voltage level of the first power voltage V1 starts rising at a third time t13 and reaches the first target voltage level Va at a fourth time t14.

In addition, the voltage level of the first power voltage V1 starts falling at a fifth time t15 and reaches the voltage level of 0V at a sixth time t16. Meanwhile, the voltage level of the second power voltage V2 starts falling at a seventh time t17 and reaches the voltage level of 0V at an eighth time t18.

Referring to a period from the first time t11 to the fourth time t14, since the second power voltage V2 starts rising earlier than the first power voltage V1, the level shifter circuit 743 of the input circuit is driven earlier than the buffer circuit 741 of the input circuit.

When the fourth inverter INV4 starts being driven earlier than the third inverter INV3 in a situation in which the level shifter circuit 743 does not receive any input, the level shifter circuit 743 and the input circuit including the level shifter circuit 743 may unstably operate. That is, when the third and fourth inverters INV3 and INV4 of the level shifter circuit 743 are driven earlier than the first and second inverters INV1 and INV2 of the buffer circuit 741, an input terminal of the level shifter circuit 743 is floated, and accordingly, the state of the output voltage signal Vout output by the level shifter circuit 743 becomes unstable. Therefore, there occurs a limitation that the first power voltage V1 needs to rise earlier than the second power voltage V2 so as to achieve a stable operation of the input circuit. When the limitation is not satisfied in rising operation of the first and second power voltages V1 and V2, a malfunction may occur in the level shifter circuit 743 and the input circuit having the same.

Figure 9A:
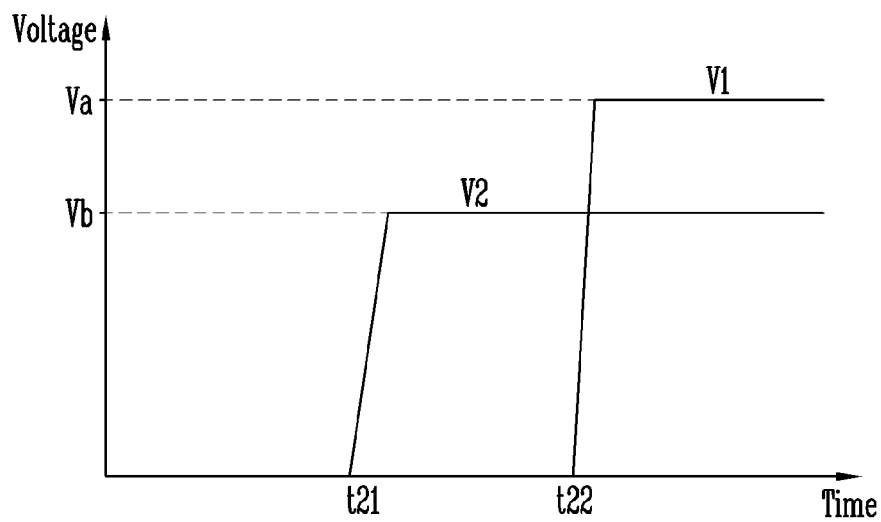
FIG. 9A is a graph illustrating a case where the second power voltage rises earlier than the first power voltage.
Figure 9B:
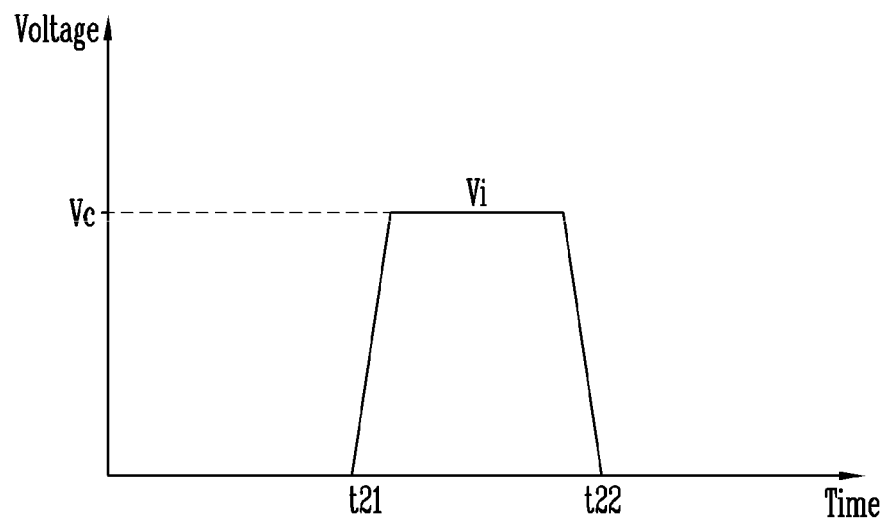
FIG. 9B is a graph illustrating a voltage level of an input terminal node of the level shifter circuit when the first and second power voltages rise as shown in FIG. 9A.
Figure 9C:
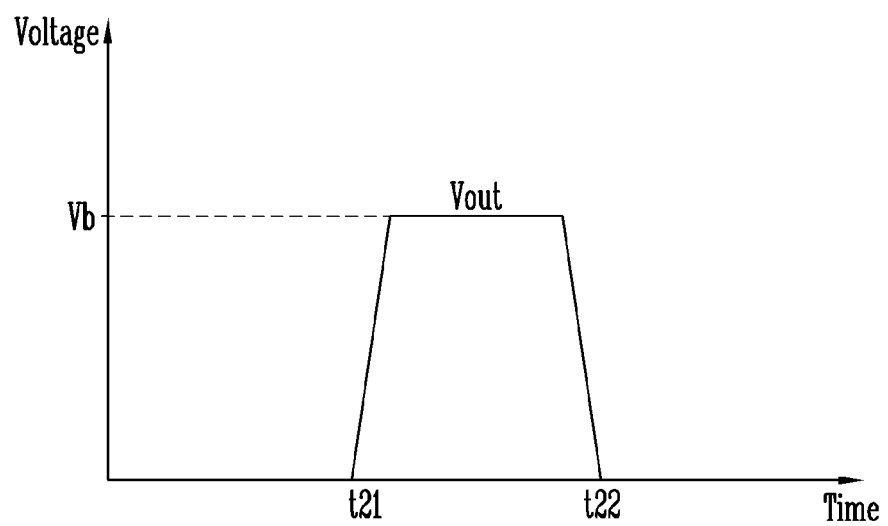
FIG. 9C is a graph illustrating a voltage level of an output voltage signal when the first and second power voltages rise as shown in FIG. 9A.

FIG. 9A is a graph illustrating a case where the second power voltage rises V2 earlier than the first power voltage V1. FIG. 9B is a graph illustrating a voltage level of the internal voltage signal Vi at an input terminal node of the level shifter circuit 743 when the first and second power voltages V1 and V2 rise as shown in FIG. 9A. FIG. 9C is a graph illustrating a voltage level of the output voltage signal Vout when the first and second power voltages V1 and V2 rise as shown in FIG. 9A.

Referring to FIG. 9A, a graph is illustrated similarly to the situation in the period from the first time t11 to the fourth time t14 shown in FIG. 8. That is, the second power voltage V2 starts rising and reaches the second target voltage level Vb at a first time t21, and the first power voltage V1 starts rising and reaches the first target voltage level Va at a second time t22.

Referring to FIGS. 9A and 9B together, since the second power voltage V2 rises in a state in which the first power voltage V1 is 0V at the first time t21, the third and fourth inverters INV3 and INV4 of the level shifter circuit 743 are driven. Meanwhile, since the first power voltage V1 is 0V, the buffer circuit 741 is in a state it does not operate. Therefore, an output terminal node of the buffer circuit 741, i.e., a node generating the internal voltage signal Vi is floated. The voltage level of the internal voltage signal Vi may rise to an arbitrary value. In FIG. 9B, an example in which the voltage level of the internal voltage signal Vi rises to a voltage level Vc is illustrated. Since the output terminal of the third inverter INV3 has been in a situation in which it is floated, the voltage level Vc of the internal voltage signal Vi may be either a level which allows the output voltage signal Vout as the output of the level shifter circuit 743 to become a high level (e.g., 0.9V) or a level which allows the output voltage signal Vout to become a low level (e.g., 0V). That is, the output voltage signal Vout as the output of the level shifter circuit 743 may be a high level or a low level. The output voltage signal Vout having a high level may indicate a first logic value (e.g., a logic high value), whereas the output voltage signal Vout having a low level may indicate a second logic value (e.g., a logic low value). In FIG. 9C, there is illustrated a case where the output voltage signal Vout rises to the second target voltage level Vb, i.e., a high level at the time t21. However, this is indefinite, and the output voltage signal Vout may be a low level at the time t21 according to an initial voltage level of the internal voltage signal Vi. For example, the output voltage signal Vout may indicate either a logic high value or a logic high value according to the voltage level Vc of the internal voltage signal Vi at the output terminal node of the buffer circuit 741 that floats, and thus a stable operation of the input circuit may not be ensured.

Subsequently, since the first power voltage V1 starts rising at the second time t22, the buffer circuit 741 starts being driven. When the input voltage signal Vin is 0V, the output of the buffer circuit 741 may also be 0V at the time t22 as shown in FIG. 9B. Thus, the voltage level of the internal voltage signal Vi also becomes 0V. Accordingly, the output voltage signal Vout falls to 0V at the time t22 as shown in FIG. 9C.

Referring to FIG. 9C, the output voltage signal Vout is 0V before the first time t21 and after the second time t22. However, in a period from the first time t21 to the second time t22, the output voltage signal Vout may be the second target voltage level Vb as a high level as shown in FIG. 9C, or be the voltage level of 0V as a low level, unlike FIG. 9C. This is because the internal voltage signal Vi as an input node voltage of the level shifter circuit 743 is indefinite. This may result in the instability of an operation of the input circuit.

Figure 10:
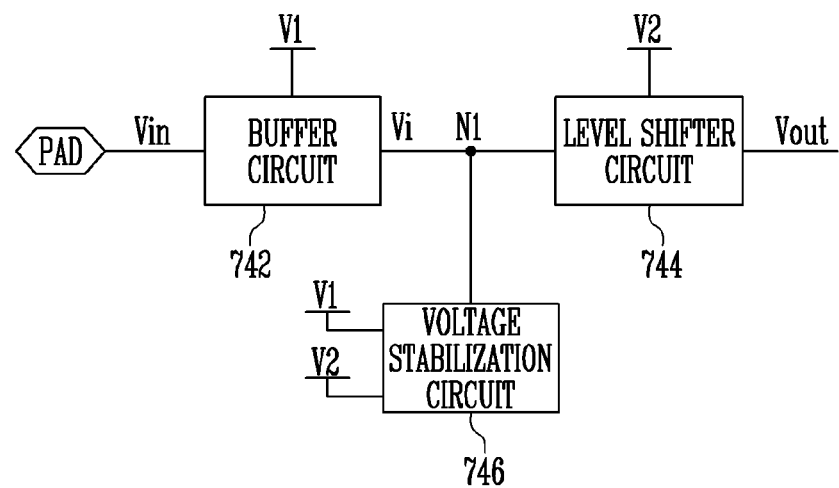
FIG. 10 is a block diagram illustrating an input circuit in accordance with an embodiment of the present disclosure.

Accordingly, an input circuit in accordance with an embodiment of the present disclosure includes a voltage stabilization circuit for stabilizing a voltage of the input terminal node of a level shifter circuit (e.g., a level shifter circuit 743 in FIG. 10). When the second power voltage V2 rises earlier than the first power voltage V1, the voltage stabilization circuit maintains the voltage of the input terminal node of the level shifter circuit as a low level. Accordingly, the voltage of the input terminal node of the level shifter circuit is definitely maintained as a low level, before the first power voltage rises and after the second power voltage rises. Thus, the operation of the input circuit is stably maintained, regardless of whether the first power voltage rises earlier than the second power voltage.

FIG. 10 is a block diagram illustrating an input circuit in accordance with an embodiment of the present disclosure.

The input/output circuit 250 shown in FIG. 1 and the host interface 740 shown in FIG. 3 may be implemented as an input circuit as shown in FIG. 10. For example, each of the input/output circuit 250 and the host interface 740 may include the input circuit of FIG. 10. The input circuit may receive a signal applied through a pad PAD from an external device or a host (e.g., the host 2000 in FIG. 2). The signal may be a control signal including a command and an address, or be a data signal. A voltage of an input voltage applied through the pad PAD may be equal to or different from an input terminal power voltage VDDO or an internal power voltage VDD.

Referring to FIG. 10, the input circuit includes a buffer circuit 742, a level shifter circuit 744, and a voltage stabilization circuit 746. The buffer circuit 742 and the level shifter circuit 744, which are shown in FIG. 10, may be configured substantially identically to the buffer circuit 741 and the level shifter circuit 743, which are shown in FIGS. 4 to 6. Therefore, overlapping descriptions of the buffer circuit 742 and the level shifter circuit 744 will be omitted for the interest of brevity.

The voltage stabilization circuit 746 is driven based on the first power voltage V1 and the second power voltage V2. More specifically, the voltage stabilization circuit 746 maintains a voltage at a node N1 that is an input node of the level shifter circuit 744 as a low level, when the first power voltage V1 has a low level, e.g., the voltage level of 0V and the second power voltage V2 has a high level, e.g., the second target level Vb. A detailed configuration of the voltage stabilization circuit 746 will be described later with reference to FIGS. 11 and 12.

Figure 11:
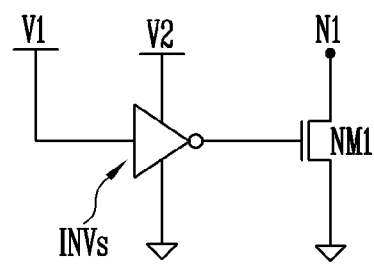
FIG. 11 is a circuit diagram illustrating a voltage stabilization circuit shown in FIG. 10 in accordance with an embodiment.

FIG. 11 is a circuit diagram illustrating the voltage stabilization circuit 746 shown in FIG. 10 in accordance with an embodiment of the present disclosure.

Referring to FIG. 11, the voltage stabilization circuit 746 includes a logic device (e.g., an inverter) INVs and a switching device (e.g., an NMOS transistor) NM1. The inverter INVs is driven by a ground voltage and the second power voltage V2, and receives the first power voltage V1 as an input. An output of the inverter INVs is coupled to a gate terminal of the NMOS circuit NM1. The NMOS transistor NM1 is coupled between a node N1 and a ground. The node N1 is an input terminal node of the level shifter circuit 744 in FIG. 10.

Figure 12:
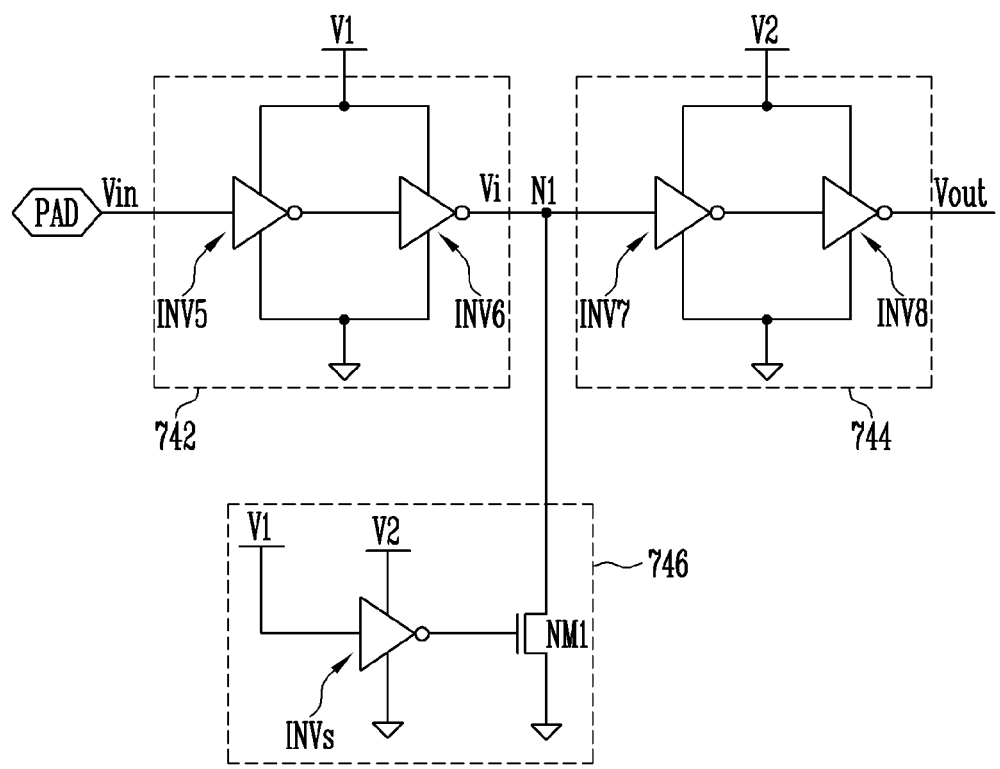
FIG. 12 is a circuit diagram illustrating in more detail the input circuit shown in FIG. 10 in accordance with an embodiment of the present disclosure.

FIG. 12 is a circuit diagram illustrating in more detail the input circuit shown in FIG. 10 in accordance with an embodiment of the present disclosure.

Referring to FIG. 12, the buffer circuit 742 may include a fifth inverter INV5 and a sixth inverter INV6. The fifth inverter INV5 may invert an input voltage signal Vin and output the inverted signal as an output signal. The sixth inverter INV6 may receive the output signal of the fifth inverter INV5, invert the output signal, and then output the inverted output signal as an internal voltage signal Vi. The fifth and sixth inverter INV5 and INV6 may be driven by a ground voltage and the first power voltage V1. Therefore, the internal voltage signal Vi may be a signal having a range of 0V to the first power voltage V1.

The level shifter circuit 744 may include a seventh inverter INV7 and an eighth inverter INV8. The seventh inverter INV7 may invert a voltage at the node N1 and output the inverted voltage as an output signal. The voltage at the node N1 may be the internal voltage signal Vi. The eighth inverter INV8 may receive the output signal of the seventh inverter INV7, invert the output signal, and then output the inverted output signal as an output voltage signal Vout. The seventh inverter INV7 and the eighth inverter INV8 may be driven by the ground voltage and the second power voltage V2. Therefore, the output voltage signal may be a signal having a range of 0V to the second power voltage V2.

The NMOS transistor NM1 of the voltage stabilization circuit 746 is coupled to the node N1 that is the input terminal node of the level shifter circuit 744.

Figure 13A:
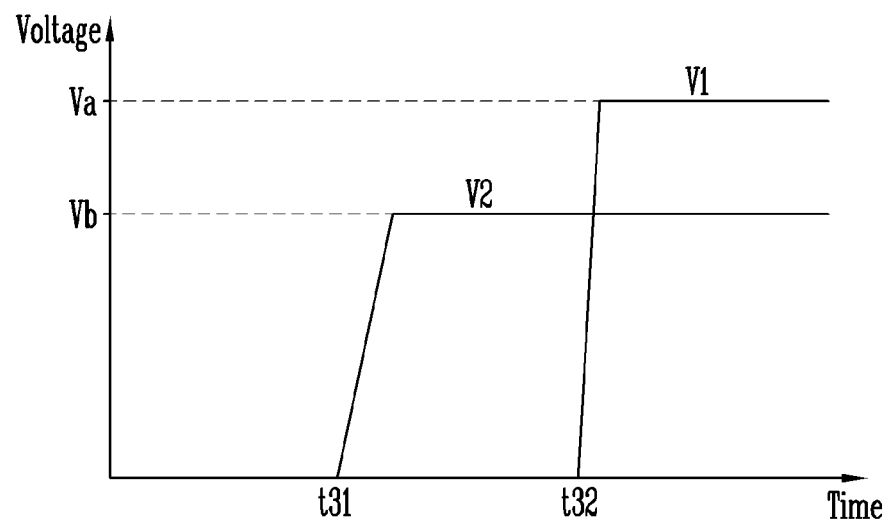
FIG. 13A is a graph illustrating a case where a second power voltage rises earlier than a first power voltage.
Figure 13B:
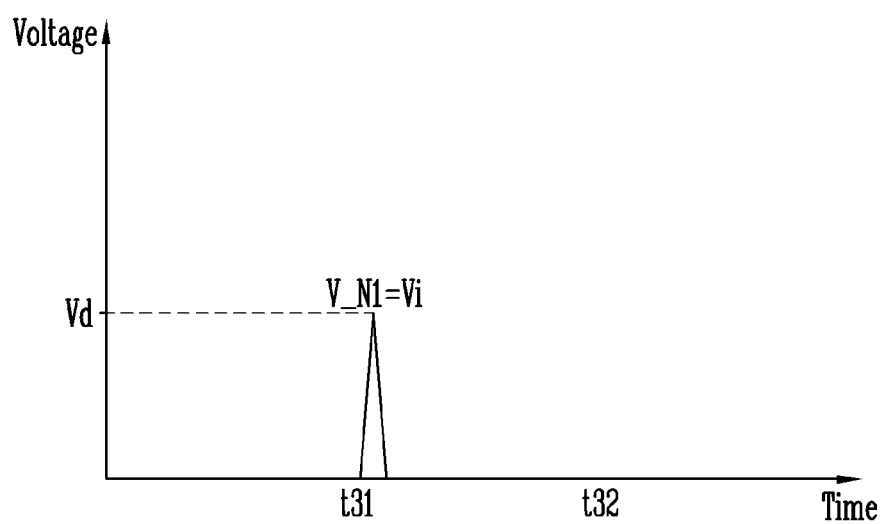
FIG. 13B is a graph illustrating a voltage level at an input terminal node of a level shifter circuit when the first and second power voltages rise as shown in FIG. 13A.
Figure 13C:
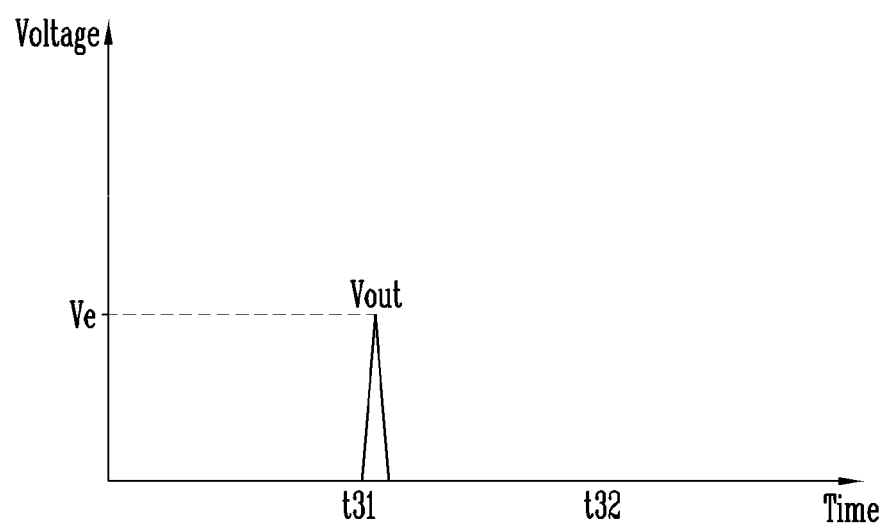
FIG. 13C is a graph illustrating a voltage level of an output voltage signal when the first and second power voltages rise as shown in FIG. 13A.

FIG. 13A is a graph illustrating a case where the second power voltage V2 rises earlier than the first power voltage V1. FIG. 13B is a graph illustrating a voltage level at the input terminal node N1 of the level shifter circuit 744 when the first and second power voltages V1 and V2 rise as shown in FIG. 13A. FIG. 13C is a graph illustrating a voltage level of the output voltage signal Vout when the first and second power voltages V1 and V2 rise as shown in FIG. 13A.

Referring to FIG. 13A, a graph substantially identical to that shown in FIG. 9A is illustrated. That is, the second power voltage V2 starts rising and reaches the second target level Vb at a first time t31, and the first power voltage V1 starts rising and reaches the first target voltage level Va at a second time t32.

Referring to FIGS. 13A and 13B together, since the second power voltage V2 rises to the second target voltage level Vb in a state in which the first power voltage V1 is 0V at the first time t31, the inverter INVs of the voltage stabilization circuit 746 outputs a voltage having a high level. Accordingly, the NMOS transistor NM1 is turned on at the first time t31. In an embodiment, the inverter INVs of the voltage stabilization circuit 746 is a CMOS inverter including a PMOS transistor and an NMOS transistor coupled in series, the PMOS transistor receiving the first power voltage V1 and being coupled between the second power voltage V2 and an output node, the NMOS transistor receiving the first power voltage V1 and being coupled between the output node and a ground. For example, when the first power voltage V1 is kept substantially at 0V during a time interval between the first time t31 and the second time t32, the PMOS transistor is turned on and the NMOS transistor is turned off. As a result, the inverter INVs of the voltage stabilization circuit 746 outputs a voltage having a level substantially equal to that of the second power voltage V2. When the voltage output from the inverter INVs becomes equal to or greater than a threshold voltage of the NMOS transistor NM1, the NMOS transistor NM1 is turned on, thereby coupling the node N1 to the ground. Therefore, a ground voltage of 0V is supplied to the node N1 as the input terminal node of the level shifter circuit 744 at the first time t31. As shown in FIG. 13B, a voltage of the node N1, i.e., the internal voltage signal Vi may rise to a voltage level Vd and then fall to 0V for a short time at the first time t31. Therefore, referring to FIG. 13C, the output voltage signal Vout rises to a voltage level Ve and then falls to 0V for a short time at the first time t31. Referring to FIG. 13B, the voltage level Vd may be equal to or less than a given level. Referring to FIG. 13C, the voltage level Ve of the output voltage signal Vout may be sufficiently low to indicate a logic low value, thereby maintaining the output voltage signal Vout at the logic low value. That is, the internal voltage signal Vi at the input terminal node of the level shifter circuit 744 may be kept equal to or less than the given level sufficient to maintain the output voltage signal Vout of the level shifter circuit 744 at the logic low value, when the second power voltage V2 is rising and the first power voltage V1 is kept substantially at 0V.

Subsequently, since the first power voltage V1 starts rising at the second time t32 and reaches the first target voltage level Va, the inverter INVs of the voltage stabilization circuit 746 outputs a voltage having a low level, e.g., the voltage of 0V. Accordingly, the NMOS transistor NM1 is turned off at the second time t32. When the NMOS transistor NM1 is turned off, coupling between the node N1 and the ground voltage is interrupted. For example, when the NMOS transistor NM1 is turned off, the node N1 may be decoupled from the ground. When the input voltage signal Vin has a low level (e.g., 0V), the buffer circuit 742 may output the internal voltage signal Vi having a low level. Accordingly, the output voltage signal Vout of the level shifter circuit 744 can maintain the voltage level of 0V at the second time t32.

Consequently, according to the input circuit in accordance with an embodiment of the present disclosure, the voltage stabilization circuit 746 maintains, as a low level, the voltage at the node N1 that is the input terminal node of the level shifter circuit 744 when the second power voltage V2 rises earlier than the first power voltage V1. Accordingly, the output voltage signal Vout of the level shifter circuit 744 is stably maintained.

Meanwhile, unlike as shown in FIGS. 13A to 13C, when the first power voltage V1 rises earlier than the second power voltage V2 as shown in FIG. 7, an input of the inverter INVs of the voltage stabilization circuit 746 rises early. Therefore, the NMOS transistor NM1 is turned off. Since the buffer circuit 742 is driven earlier than the level shifter circuit 744, the output voltage signal Vout is stably maintained.

As described above, according to the input circuit in accordance with an embodiment of the present disclosure, the output voltage signal Vout stably maintains a logic low value when the first power voltage V1 rises earlier than the second power voltage V2 or when the second power voltage V2 rises earlier than the first power voltage V1.

Figure 14:
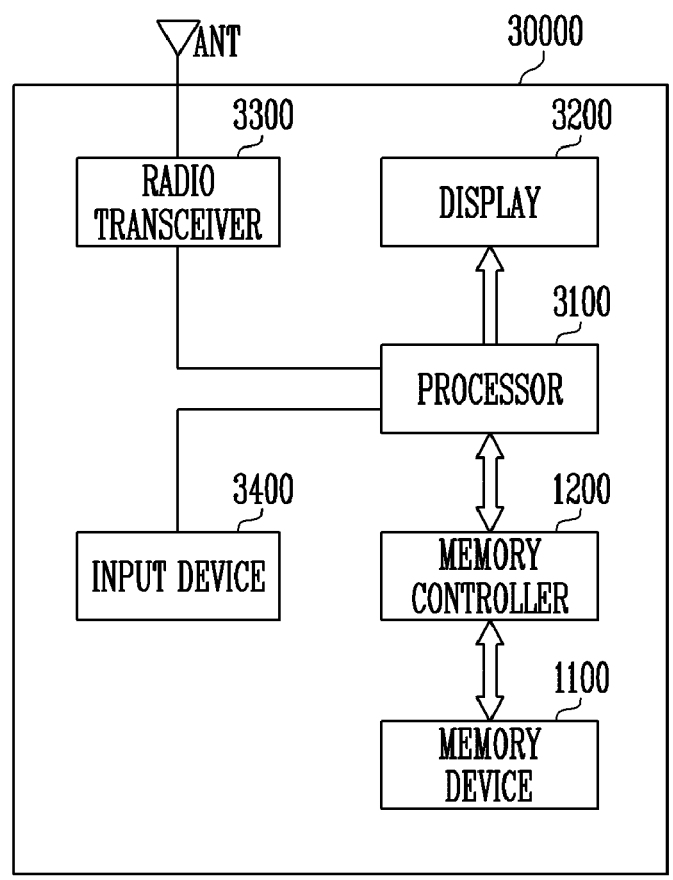
FIG. 14 is a diagram illustrating a memory system including the memory device shown in FIG. 1 according to an embodiment.

FIG. 14 is a diagram illustrating a memory system 30000 including the memory device 1100 shown in FIG. 1 according to an embodiment.

Referring to FIG. 14, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 15:
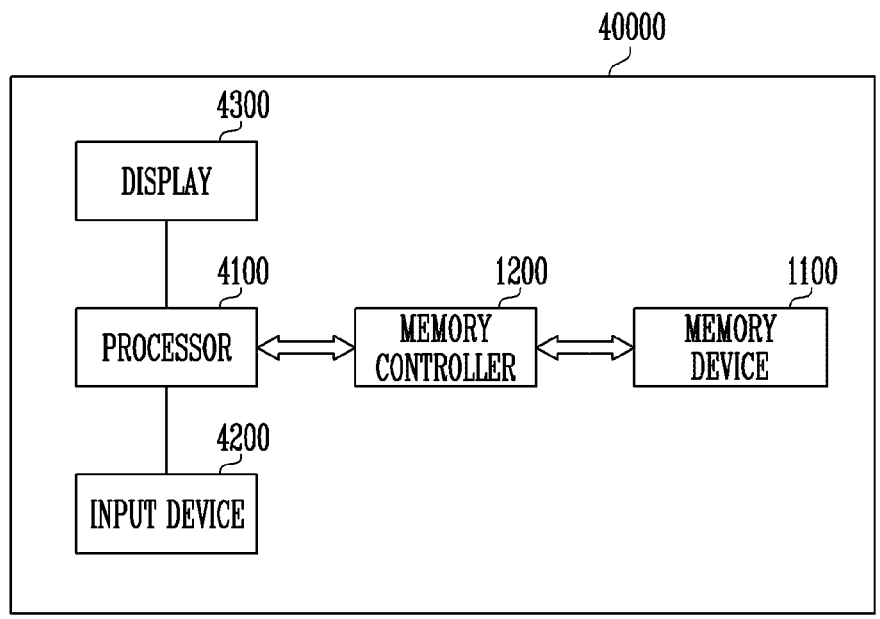
FIG. 15 is a diagram illustrating a memory system including the memory device shown in FIG. 1 according to an embodiment.

FIG. 15 is a diagram illustrating a memory system 40000 including the memory device 1100 shown in FIG. 1 according to an embodiment.

Referring to FIG. 15, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 16:
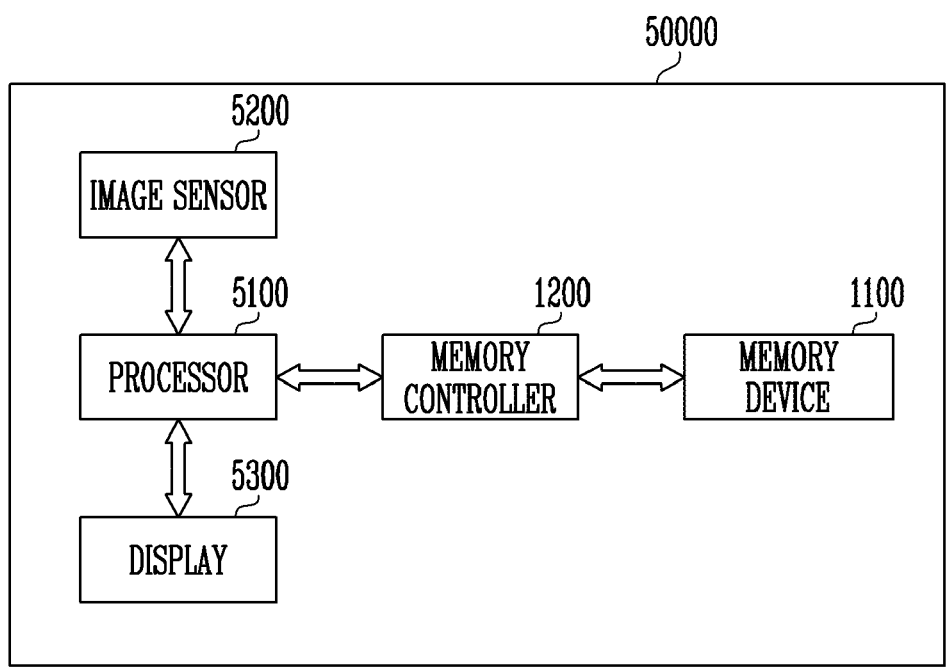
FIG. 16 is a diagram illustrating a memory system including the memory device shown in FIG. 1 according to an embodiment.

FIG. 16 is a diagram illustrating a memory system 50000 including the memory device 1100 shown in FIG. 1 according to an embodiment.

Referring to FIG. 16, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 17:
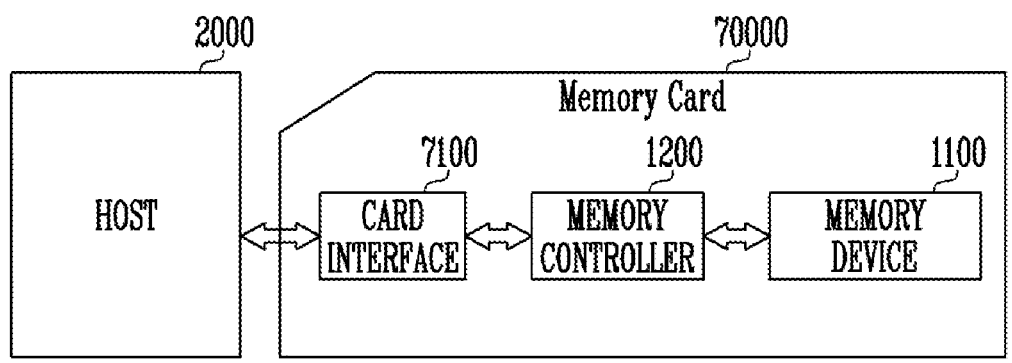
FIG. 17 is a diagram illustrating a memory system including the memory device shown in FIG. 1 according to an embodiment.

FIG. 17 is a diagram illustrating a memory system 70000 including the memory device 1100 shown in FIG. 1 according to an embodiment.

Referring to FIG. 17, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a Secure Digital (SD) card interface or a Multi-Media Card (MMC) interface, but the present disclosure is not limited thereto.

The card interface 7100 may interface data exchange between a host 2000 and the memory controller 1200 according to a protocol of the host 2000. In some embodiments, the card interface 7100 may support a Universal Serial Bus (USB) protocol and an InterChip (IC)-USB protocol. The card interface 7100 may mean hardware capable of supporting a protocol used by the host 2000, software embedded in the hardware, or a signal transmission scheme.

In accordance with an embodiment of the present disclosure, there can be provided a memory device and a memory system having an input circuit capable of improving the stability of the memory system.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and embodiments of the present disclosure are not limited thereto. That is, it should be apparent to those skilled in the art that various modifications can be made on the basis of the technological scope of the present disclosure.

Meanwhile, some embodiments of the present disclosure have been described in the drawings and specification. Although specific terminologies are used here, those are only to explain the above-described embodiments of the present disclosure. Therefore, embodiments of the present disclosure are not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. An input circuit comprising:
   a buffer circuit coupled to a pad, the buffer circuit configured to receive a first power voltage as a power of the buffer circuit and to provide an output signal to a connection node;
   a level shifter circuit configured to receive a second power voltage as a power of the level shifter circuit and a voltage of the connection node as an input signal; and
   a voltage stabilization circuit configured to receive the first power voltage and the second power voltage as input signals, respectively, and to maintain a voltage of the connection node sufficient to keep an output signal of the level shifter circuit at a first logic value when the first power voltage has the first logic value after the second power voltage starts rising to reach a second target level of the second power voltage corresponding to a second logic value,
   wherein a first target level of the first power voltage corresponds to the second logic value, and the first target level is different from the second target level.

2. The input circuit of claim 1, wherein the buffer circuit includes:
   a first inverter coupled to the pad, the first inverter being driven by the first power voltage and a ground voltage; and
   a second inverter coupled to an output terminal of the first inverter, the second inverter being driven by the first power voltage and the ground voltage.

3. The input circuit of claim 1, wherein the level shifter circuit includes:
   a third inverter coupled to the connection node, the third inverter being driven by the second power voltage and a ground voltage; and
   a fourth inverter coupled to an output terminal of the third inverter, the fourth inverter being driven by the second power voltage and the ground voltage.

4. The input circuit of claim 1, wherein the voltage stabilization circuit includes:
   a fifth inverter receiving the first power voltage as an input of the fifth inverter, the fifth inverter being driven by the second power voltage and a ground voltage; and
   a switching device configured to drop a voltage level of the connection node based on an output signal of the fifth inverter.

5. The input circuit of claim 4, wherein the switching device includes an NMOS transistor.

6. The input circuit of claim 1, wherein the voltage stabilization circuit maintains the input signal of the level shifter circuit at a specific level such that the level shifter circuit is not driven until the first power voltage reaches the first target level.

7. The input circuit of claim 1, wherein the voltage stabilization circuit is configured to enable the level shifter circuit when the first power voltage reaches the first target level and the second power voltage reaches the second target level.

8. The input circuit of claim 7, wherein the first target level is higher than the second target level.

9. A memory device comprising:
   a memory cell array including a plurality of memory blocks, each of the plurality of memory blocks including a plurality of memory cells;
   one or more peripheral circuits configured to perform an operation on a memory block selected from the plurality of memory blocks; and
   a control logic configured to control the peripheral circuits,
   wherein the peripheral circuits include an input/output circuit configured to handle one or more of a command, an address, and data, the input/output circuit including:
      a buffer circuit configured to receive a first power voltage as a power of the buffer circuit and to provide an output signal to a connection node, a first target level corresponding to a logic high value of the first power voltage;
      a level shifter circuit configured to receive a second power voltage as a power of the level shifter circuit and to level-shift the output signal based on a voltage level of the connection node, a second target level corresponding to a logic high value of the second power voltage, the second target level being lower than the first target level; and
      a voltage stabilization circuit configured to receive the first power voltage and the second power voltage as input signals, respectively, to disable the level shifter circuit when the second power voltage reaches the second target level and the first power voltage does not reach the first target level, and to be disabled when the second power voltage reaches the second target level and the first power voltage reaches the first target level.

10. The memory device of claim 9, wherein the voltage stabilization circuit includes:
   a logic device receiving the first power voltage as an input, the logic device being driven by the second power voltage and a ground voltage; and
   a switching device coupled between the ground voltage and the connection node, the switching device configured to be enabled based on an output signal of the logic device.

11. The memory device of claim 10, wherein the logic device includes an inverter and the switching device includes an NMOS transistor.

12. The memory device of claim 10, wherein the buffer circuit includes:
   a first inverter coupled to the pad, the first inverter being driven by the first power voltage and the ground voltage; and
   a second inverter coupled to an output terminal of the first inverter, the second inverter being driven by the first power voltage and the ground voltage.

13. The memory device of claim 12, wherein the level shifter circuit includes:
   a third inverter coupled to an output terminal of the second inverter, the third inverter being driven by the second power voltage and the ground voltage; and
   a fourth inverter coupled to an output terminal of the third inverter, the fourth inverter being driven by the second power voltage and the ground voltage.

14. The memory device of claim 10, wherein the switching device is configured to drop the voltage level of the connection node when the second power voltage reaches the second target level and the first power voltage does not reach the first target level.

15. An input circuit comprising:
   a buffer circuit including a first input node and a first output node, the buffer circuit configured to receive a first input signal from the first input node and a first external voltage, a first target level corresponding to a logic high value of the first power voltage, and to output a buffered signal through the first output node;
   a level shifter circuit including a second input node corresponding to the first output node and a second output node, the level shifter circuit configured to receive the buffer signal as an input and a second external voltage, a second target level corresponding to a logic high value of the second power voltage, the second target level being lower than the first target level, and to control a voltage level of the buffered signal; and
   a voltage stabilization circuit configured to selectively discharge a voltage level of the second input node when the second external voltage reaches the second target level and the first external voltage does not reach the first target level.

* * * * *